(12) United States Patent
Lee

(10) Patent No.: US 7,990,206 B2
(45) Date of Patent: Aug. 2, 2011

(54) DEVICE FOR SUPPLYING TEMPERATURE DEPENDENT NEGATIVE VOLTAGE

(75) Inventor: Kang-Seol Lee, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/727,018

(22) Filed: Mar. 18, 2010

(65) Prior Publication Data

US 2010/0188139 A1    Jul. 29, 2010

Related U.S. Application Data

(62) Division of application No. 12/000,232, filed on Dec. 11, 2007, now abandoned.

(30) Foreign Application Priority Data

Feb. 3, 2007  (KR) .................. 10-2007-0020726

(51) Int. Cl.
*G05F 1/10* (2006.01)
*G05F 3/02* (2006.01)

(52) U.S. Cl. ............ 327/536; 327/537; 363/59; 363/60

(58) Field of Classification Search .................. 327/148, 327/157, 536, 537; 363/59, 60
See application file for complete search history.

(56) References Cited

U.S. PATENT DOCUMENTS

| | | | | |
|---|---|---|---|---|
| 5,629,646 | A * | 5/1997 | Menezes et al. | 327/536 |
| 6,194,920 | B1* | 2/2001 | Oguri | 327/65 |
| 6,667,662 | B2* | 12/2003 | Saito | 331/1 A |
| 2002/0017946 | A1* | 2/2002 | Fujii et al. | 327/534 |
| 2002/0171470 | A1* | 11/2002 | Sim et al. | 327/536 |
| 2005/0110560 | A1* | 5/2005 | Kim et al. | 327/536 |
| 2008/0024198 | A1* | 1/2008 | Bitonti et al. | 327/536 |

* cited by examiner

*Primary Examiner* — Lincoln Donovan
*Assistant Examiner* — Brandon S Cole
(74) *Attorney, Agent, or Firm* — IP & T Group LLP

(57) ABSTRACT

A negative voltage supply device includes a negative voltage detector and a negative voltage pumping unit. The negative voltage pumping unit pumps a negative voltage in response to a detection signal. The negative voltage detector detects a level of a negative voltage by using a first element and a second element, which are different in the degree of change in their respective resistance values depending on the temperature, and outputs the detection signal. The detection signal informs the negative voltage pumping unit that pumping of the negative voltage is no longer needed.

9 Claims, 7 Drawing Sheets

DEVICE FOR SUPPLYING TEMPERATURE DEPENDENT NEGATIVE VOLTAGE

CROSS-REFERENCE TO RELATED APPLICATION

This application is a division of U.S. patent application Ser. No. 12/000,232 filed on Dec. 11, 2007 now abandoned, which claims priority of Korean patent application number 10-2007-0020726 filed on Mar. 2, 2007. The disclosure of each of the foregoing applications is incorporated herein by reference in its entirety.

BACKGROUND OF THE INVENTION

The invention relates to a semiconductor device; and, more particularly, to a negative voltage supply device used for generating a negative voltage lower than a ground voltage in a variety of semiconductor devices.

Hereinafter, a negative voltage supply device will be explained in conjunction with a memory device that employs the negative voltage supply.

The reason that a memory device requires a negative voltage is to employ a negative word line driving scheme. The negative word line driving scheme is a scheme, in which, when a word line driver drives a word line, it supplies a high voltage VPP to the word line for enabling thereof, while it supplies a negative voltage VBBW below a ground voltage VSS to the word line for disabling thereof.

That is, the ground voltage VSS is usually supplied to the word line to disable the word line, but the negative voltage VBBW below the ground voltage VSS is supplied thereto for the same purpose in the negative word line driving scheme.

By using such a negative word line driving scheme, refresh characteristics as well as other AC parameters are improved. Especially, as the negative voltage VBBW below the ground voltage VSS is utilized as an electric potential to disable a word line, cell retention time is extended, resulting in an increase in a refresh cycle. Moreover, the negative word line driving scheme is employed because it can decrease a VPP burden by the use of a low Vcc and improve a write recovery time TWR.

FIG. 1 is a block diagram of a conventional negative voltage supply device.

As shown therein, the conventional negative voltage supply device includes a negative voltage detector 10 for determining whether to pump a negative voltage, and a negative voltage pumping unit having an oscillator 20, a pump controller 30, and a charge pump 40 for pumping the negative voltage.

The negative voltage detector 10 is a unit for detecting the level of the negative voltage VBBW, and outputs a detection signal bbweb for determining whether to pump the negative voltage. The oscillator 20 receives the detection signal bbweb and outputs a periodic signal OSC. The pump controller 30 outputs pump control signals p1, p2, g1, and g2 in response to the output signal OSC from the oscillator 20. Lastly, the charge pump 40 pumps the negative voltage VBBW in response to the pump control signals p1, p2, g1, and g2. The negative voltage pumping unit 20, 30 and 40 may be designed and implemented in various configurations in a manner that it does not includes the pump controller 30 by allowing the oscillator 20 to directly control the charge pump 40 as the case may be.

That is, the negative voltage pumping unit 20, 30 and 40 stops the pumping operation when the level of the negative voltage VBBW detected by the negative voltage detector 10 is sufficiently low (i.e., its absolute value is large). However, when the level of the negative voltage VBBW detected by the negative voltage detector 10 is high (i.e., its absolute value is small), the charge pump 40 performs the negative voltage VBBW pumping operation.

FIG. 2 is a detailed circuit diagram of the negative voltage detector 10 of FIG. 1.

As shown, a ground voltage VSS and a negative voltage VBBW are applied to the gate of a transistor P01 and the gate of a transistor P02, respectively. The transistors P01 and P02 are operative in a linear region, and function as a resistor, which distribute a high potential VCORE and a low potential VSS. For instance, when the negative voltage VBBW is high (i.e., its absolute value is small) and thus resistance of the transistor P02 increases, an electric potential of DET node increases, thereby outputting a detection signal bbweb as a 'low' signal bbweb from an inverter I03. On the contrary, when the negative voltage VBBW is low (i.e., its absolute value is large) and thus resistance of the transistor P02 decreases, an electric potential of DET node is lowered, thereby outputting a detection signal bbweb as a 'high' signal bbweb from the inverter I03.

That is to say, the negative voltage detector 10 detects the level of the negative voltage VBBW by voltage distribution of the transistors P01 and P02 taking the ground voltage VSS and the negative voltage VBBW, respectively.

FIG. 3 is a detailed circuit diagram of the oscillator 20 of FIG. 1.

As depicted in the drawing, the oscillator 20 may be configured in the shape of a ring oscillator composed of a NOR gate 21 accepting the detection signal bbweb, and inverters I04 to I09.

When a 'high' sensing signal bbweb is inputted to the NOR gate 21, the NOR gate 21 always outputs a 'low' signal. However, when a 'low' sensing signal bbweb is inputted, the NOR gate 21 serves as an inverter, so that a signal with a regular period is outputted by the inverters I04 to I09 connected in a ring shape.

FIG. 4 is a detailed circuit diagram of the pump controller 30 of FIG. 1, and FIG. 5 is an operation timing diagram of the pump controller 30.

As shown therein, the pump controller 30 is provided with NAND gates 31 and 32 and a plurality of inverters I10 to I19, and outputs control signals p1, p2, g1, and g2 for control of the charge pump 40. The control signals p1 and p2 are signals for the charge pump 40 to pump, and the control signals g1 and g2 are sort of precharge signals.

FIG. 6 is a detailed circuit diagram of the charge pump 40 of FIG. 1.

The charge pump 40 functions to generate the negative voltage VBBW and is provided with PMOS transistors 41, 42, 43, and 44 which receive the control signals p1, p2, g1, and g2 at nodes where its sources and drains are connected, respectively, and operate as capacitors, as shown in FIG. 6.

Briefly explaining the operation, the charge pump 40 pumps the negative voltage VBBW upon receipt of the control signals p1 and p2, and makes electric potentials at 'a' and 'b' nodes fall to the ground voltage VSS upon receipt of the control signals g1 and g2.

As described earlier, the memory device is provided with the negative voltage supply device, which generates the negative voltage VBBW and is used as an electric potential for turning a cell transistor off, i.e., a word line disabling potential, thereby enabling negative word line driving.

Meanwhile, leakage current of a cell transistor is characterized by increasing as temperature rises. Thus, the value of the negative voltage VBBW at a high temperature needs to be decreased considerably, but does not need to do so if the temperature is lowered from room temperature to a lower temperature. Accordingly, using the prior art negative voltage supply device which generates a fixed negative voltage VBBW regardless of temperature causes an excessive current consumption in pumping the negative voltage VBBW at room and low temperatures.

SUMMARY OF THE INVENTION

Embodiments of the present invention are directed to provide an apparatus for supplying a negative voltage having various voltage level dependent on voltage variation.

In accordance with an aspect of the present invention, there is provided a negative voltage supply device including a negative voltage detector and a negative voltage pumping unit. The negative voltage pumping unit pumps a negative voltage in response to a detection signal. The negative voltage detector detects a level of a negative voltage by using a first element and a second element, which are different in the degree of change in their respective resistance values depending on the temperature, and outputs the detection signal. The detection signal informs the negative voltage pumping unit that pumping of the negative voltage is no longer needed.

In accordance with another aspect of the present invention, there is provided a negative voltage supply device including a first negative voltage detector, a second negative voltage detector, a third negative voltage detector, a clamping part, and a negative voltage pumping unit. The first negative voltage detector detects a level of a negative voltage to output a first detection signal indicating that the level of the negative voltage is less than a first voltage. The second negative voltage detector detects a level of the negative voltage to provide a second detection signal indicating that the level of the negative voltage is less than a second voltage which is lower than the first voltage. The third negative voltage detector detects a level of the negative voltage to generate a third detection signal indicating that the level of the negative voltage is less than a third voltage varying with temperature. The clamping part logically combines the first detection signal, the second detection signal, and the third detection signal to output a fourth detection signal causing a level of the negative voltage to be dependent on temperature between the first voltage and the second voltage. The negative voltage pumping unit pumps the negative voltage in response to the fourth detection signal.

DETAILED DESCRIPTION OF THE INVENTION

Hereinafter, preferred embodiments of the present invention will be set forth in detail with reference to the accompanying drawings so that those skilled in the art can easily carry out the invention.

Figure 1:
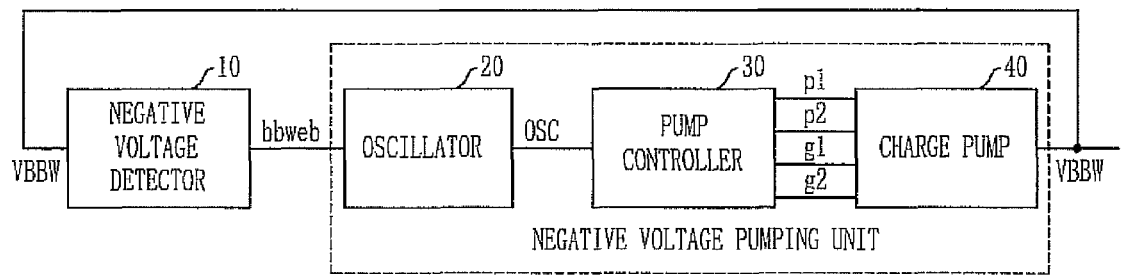
FIG. 1 is a block diagram of a conventional negative voltage supply device.

A negative voltage supply device in accordance with an embodiment of the invention includes a negative voltage detector that detects the level of a negative voltage and outputs a temperature dependent signal, and a negative voltage pumping unit that pumps the negative voltage in response to the detection signal. That is, the negative voltage supply device of the invention has the same block diagram as that of the conventional negative voltage supply device shown in FIG. 1.

Figure 6:
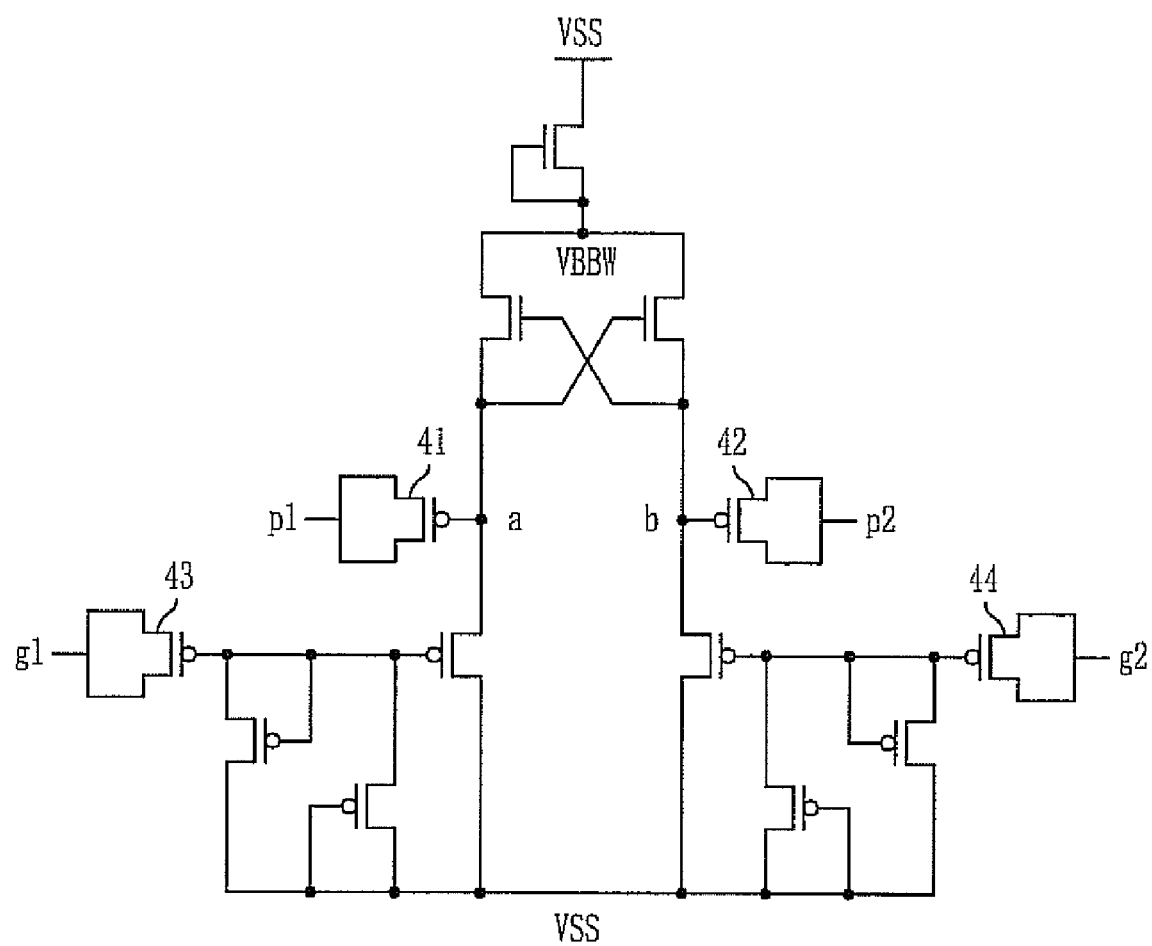
FIG. 6 is a detailed circuit diagram of the charge pump of FIG. 1.

The negative voltage pumping unit for pumping a negative voltage can be the same as shown in FIG. 6. As long as the negative voltage pumping unit selectively pumps a negative voltage in response to a detection signal outputted from the negative voltage detector, it may be incorporated with the negative voltage detector of the present invention. Because it is required that the negative voltage pumping unit meets the foregoing condition only and because the negative voltage pumping unit has been already explained earlier, a detailed description thereof will be omitted here.

Figure 7:
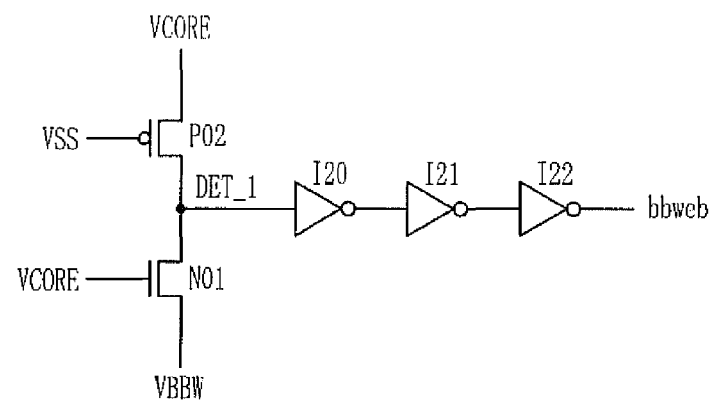
FIG. 7 is a detailed circuit diagram of a negative voltage detector included in a negative voltage supply device in accordance with an embodiment of the present invention.

FIG. 7 is a detailed circuit diagram of a negative voltage detector included in a negative voltage supply device in accordance with a first embodiment of the present invention.

As shown in the drawing, the negative voltage detector of the negative voltage supply device in accordance with the first embodiment of the invention detects the level of a negative voltage by using a first element P02 and a second element N01, which are different in the degree of change in their respective resistance values depending on the temperature, and outputs a detection signal bbweb informing that pumping of a negative voltage VBBW is no longer needed.

More specifically, the first element P02 operates as a pull-up resistor and the second element N01 operates as a pull-down resistor, and the detection signal bbweb is generated by voltage distribution of the first element P02 and the second element N01. The first element P02 may be implemented by a PMOS transistor P02 whose source receives a high voltage VCORE and gate takes a ground voltage VSS. The second element N01 may be implemented by an NMOS transistor N01 whose source receives a negative voltage VBBW and gate accepts the high voltage VCORE. The first element P02 and the second element N01 are connected in series, wherein their drains are connected to each other.

The detection signal bbweb generated by the voltage distribution (in this embodiment, voltage distribution between the high voltage VCORE and the negative voltage VBBW) by the first element P02 and the second element N01 is outputted through at least one inverter I20, I21, or I22 which takes the voltage of a connection part between the first element P02 and the second element N01, i.e., the voltage of a drain terminal DET_T.

In the conventional negative voltage supply device, the same elements, e.g., PMOS transistors, were utilized as the first and second elements for the voltage distribution. Therefore, resistance change rates of the two elements were fixed depending on the temperature, and the negative voltage VBBW levels at which a detection signal is outputted were fixed although the temperature was changed.

The present invention uses, as the first element P02 and the second element N01, a PMOS transistor P02 and an NMOS transistor N01 which have a different degree of change in their respective resistance values depending on the temperature. That is, the two transistors P02 and N01 exhibit different degrees of change in resistance value within their operating regions depending on the temperature, wherein, for example, properties of the PMOS transistor P02 are generally degraded faster than the NMOS transistor N01 at a low temperature. Thus, the level of the negative voltage VBBW for enabling the detection signal bbweb may vary depending on temperature.

In operation, the PMOS transistor P02 has a fixed resistance value in turn-on state because its gate receives the ground voltage VSS. The NMOS transistor N01 also has a fixed resistance value in turn-on state because its gate takes the high voltage VCORE and its source accepts the negative voltage VBBW. The more the level of the negative voltage VBBW (the greater the absolute value) being applied to the source of the NMOS transistor N01 is low, the more the Vgs value of the NMOS transistor N01 becomes larger. This causes the NMOS transistor N01 to be turned on more strongly, thereby lowering the electric potential of DET_T node, causing the inverter I22 to output a 'high' detection signal bbweb, and the negative voltage pumping unit to stop pumping the negative voltage VBBW.

As described above, in case of temperature variations, the PMOS transistor P02 and the NMOS transistor N01 have a different degree of change in their respective resistance values depending on the temperature, so the electric potential of DET_T node is relatively higher at a higher temperatures than at lower temperatures. In other words, the level of the negative voltage VBBW at a high temperatures needs to be even lower than at room and lower temperatures to enable ('high') the detection signal bbweb. On the contrary, the detection signal bbweb can be enabled at lower temperatures although the level of the negative voltage VBBW at lower temperatures is relatively higher than at a high temperature. Thus, when the negative voltage detector of the invention is used, it becomes possible to pump even lower negative voltage VBBW (larger absolute value) at higher temperatures and to pump even higher negative voltage VBBW (smaller absolute value) at lower temperatures.

For reference, the high voltage VCORE may be used as a bulk voltage of the PMOS transistor P02, and the negative voltage VBBW may be used as a bulk voltage of the NMOS transistor N01. And, those two transistors P01 and N01 may be set to have a certain size so that a switching level of the inverter I20 gets about ½ VCORE.

Further, the application of VCORE as a high voltage in this embodiment is for illustrative purposes only, and various powers can be used according to various designs. Preferably, the high voltage is a stable voltage insensitive to temperature.

Figure 8:
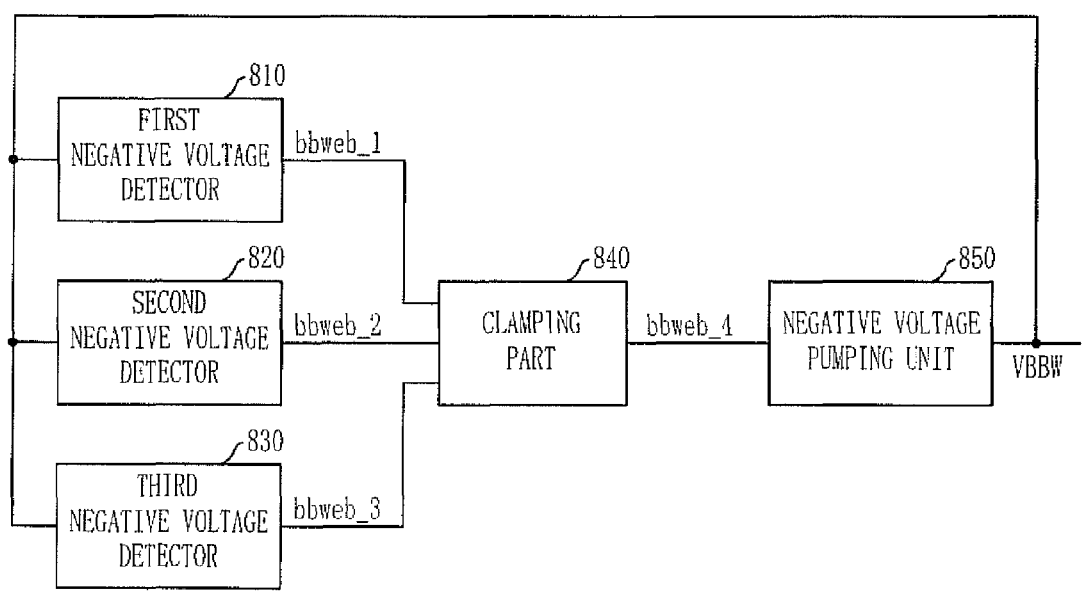
FIG. 8 is a block diagram of a negative voltage supply device in accordance with another embodiment of the present invention.

FIG. 8 is a block diagram of a negative voltage supply device in accordance with a second embodiment of the invention.

As shown therein, the negative voltage supply in accordance with a second embodiment of the invention includes a first negative voltage detector 810, a second negative voltage detector 820, a third negative voltage detector 830, a clamping part 840, and a negative voltage pumping unit 850.

Similar to the negative voltage supply device of the first embodiment described earlier, the negative voltage supply device in accordance with the second embodiment of the invention to be described with reference to FIGS. 8 to 10, supplies a negative voltage VBBW of a different level depending on temperature variations, but the voltage VBBW is restricted within a maximum level and a minimum level. That is to say, the negative voltage VBBW of too high a level or too low a level depending on the temperature is prevented from being generated, which helps the negative voltage supply device and a semiconductor device using the same to operate very stably.

The first negative voltage detector 810 detects the level of the negative voltage VBBW and outputs a first detection signal bbweb_1 that is enabled when the negative voltage VBBW is less than a first voltage. That is, the first negative voltage detector 810 disables the first detection signal bbweb_1 if the negative voltage VBBW is higher than the first voltage that is the highest level of the negative voltage VBBW, and enables it otherwise.

The second negative voltage detector 820 detects the level of the negative voltage VBBW and outputs a second detection signal bbweb_2 that is enabled when the negative voltage VBBW is less than a second voltage. That is, the second negative voltage detector 820 disables the second signal bbweb_2 if the negative voltage VBBW is higher than the second voltage that is the lowest level of the negative voltage VBBW, and enables it otherwise.

The third negative voltage detector 830 detects the level of the negative voltage VBBW and outputs a third detection signal bbweb_3 indicating that the negative voltage VBBW level is not higher than a temperature-dependent third voltage. Namely, the negative voltage VBBW detection level varies depending on the temperature. Therefore, the negative voltage detector of FIG. 7 may be employed as it is.

The clamping part 840 logically combines the first detection signal bbweb_1, the second detection signal bbweb_2, and the third detection signal bbweb_3 to output a fourth detection signal bbweb_4 that causes the negative voltage VBBW level to be temperature-dependent between the first voltage and the second voltage. More details on the clamping part 840 will be provided later with reference to FIG. 10.

The negative voltage pumping unit 850 selectively pumps the negative voltage VBBW in response to the fourth detection signal bbweb_4. While the conventional negative voltage pumping unit pumps the negative voltage VBBW in response to the detection signal bbweb, the negative voltage pumping unit of FIG. 8 pumps the negative voltage VBBW in response to the fourth detection signal bbweb_4. Except for this, the negative voltage pumping unit of this embodiment is the same as the conventional negative voltage pumping unit in terms of configuration and functions, so a detailed description thereof will be omitted here.

Figure 9A:
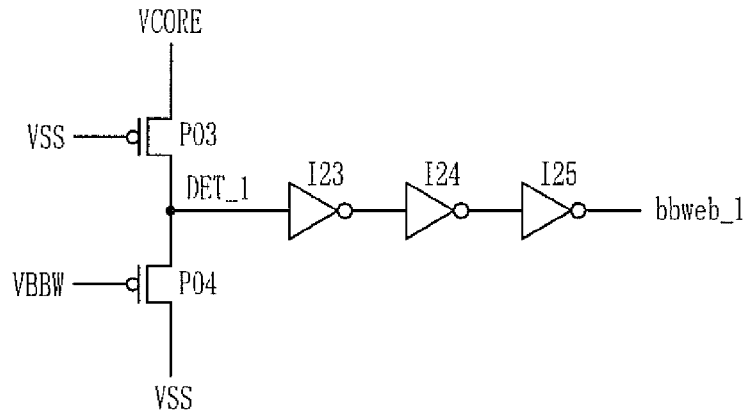
FIGS. 9A, 9B, and 9C are detailed circuit diagrams of the first negative voltage detector, the second negative voltage detector, and the third negative voltage detector shown in FIG. 8, respectively.
Figure 9B:
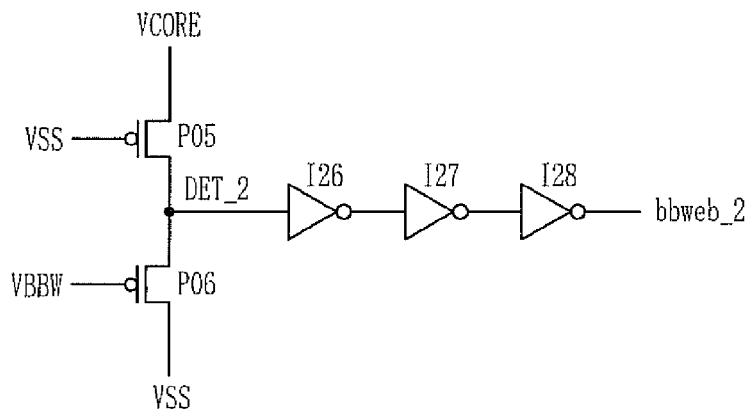
Figure 9C:
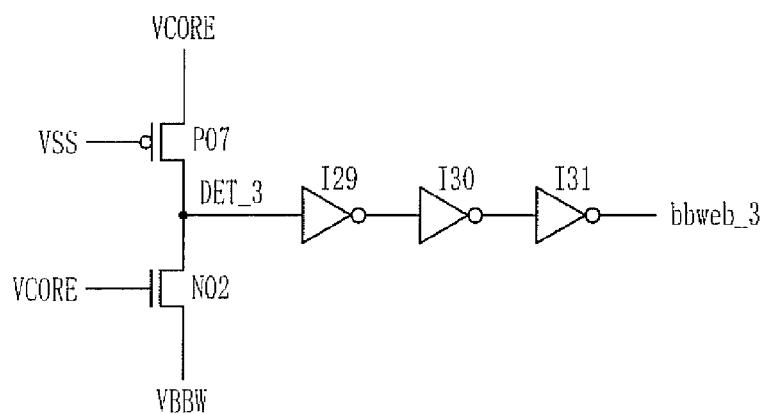

FIGS. 9A, 9B, and 9C are detailed circuit diagrams of the first negative voltage detector 810, the second negative voltage detector 820, and the third negative voltage detector 830 shown in FIG. 8, respectively.

Figure 2:
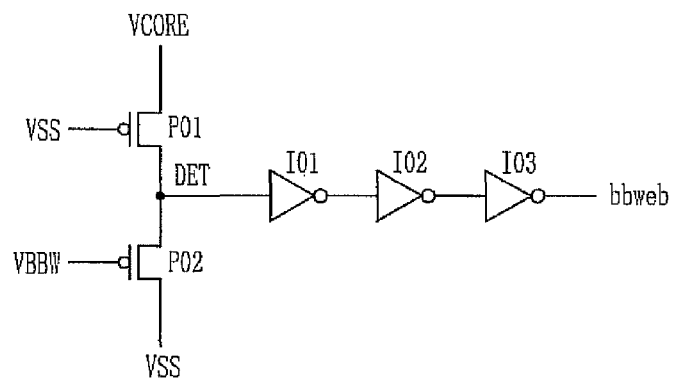
FIG. 2 is a detailed circuit diagram of the negative voltage detector depicted in FIG. 1.
Figure 3:
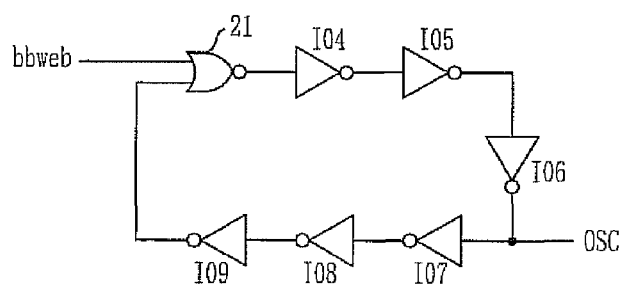
FIG. 3 is a detailed circuit diagram of the oscillator depicted in FIG. 1.
Figure 4:
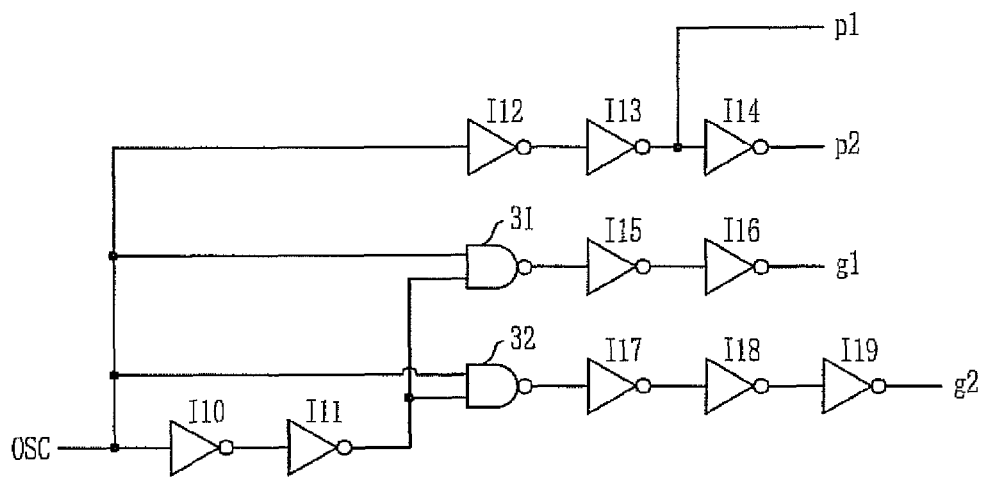
FIG. 4 is a detailed diagram of the pump controller shown in FIG. 1.
Figure 5:
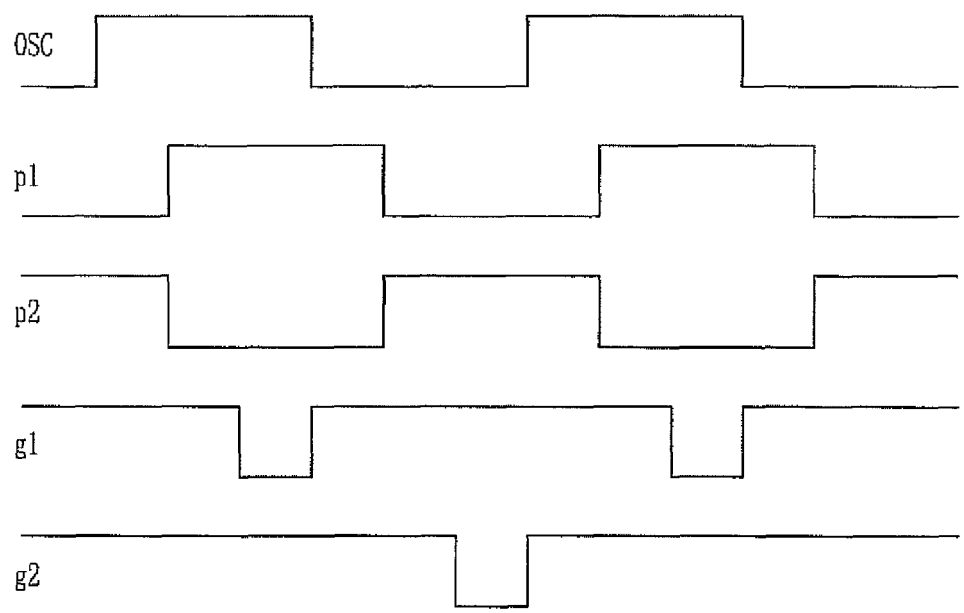
FIG. 5 is an operation timing diagram of the pump controller shown in FIG. 1.

Referring to the drawings, the first negative voltage detector 810 shown in FIG. 9A and the second negative voltage detector 820 shown in FIG. 9B have the same configuration as the conventional negative voltage detector shown in FIG. 2, so their operating principles are identical to each other.

However, the first negative voltage detector 810 shown in FIG. 9A has transistors P03 and P04 whose sizes have been adjusted to enable the first detection signal bbweb_1 when the level of the negative voltage VBBW is lower than the first voltage (which is the highest voltage for limiting the range of a negative voltage), and the second negative voltage detector 820 shown in FIG. 9B has transistors P05 and P06 whose sizes have been adjusted to enable the second detection signal bbweb_2 when the level of the negative voltage VBBW is lower than the second voltage (which is the lowest voltage for limiting the range of a negative voltage). That is, the detection levels are different from each other.

The third negative voltage detector 830 shown in FIG. 9C is basically the same as the negative voltage detector shown in FIG. 7 in terms of configuration and functions, except that its output signal is indicated on the drawing as a third detection signal bbweb_3.

The operation of FIGS. 9A, 9B, and 9C has been described in the Background of the Invention and in conjunction with FIG. 7, so it will be omitted here.

Figure 10:
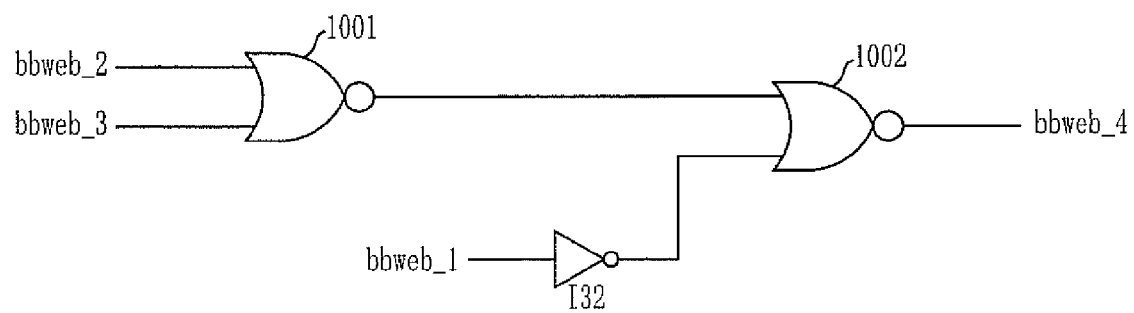
FIG. 10 is a detailed circuit diagram of the clamping part shown in FIG. 8.

FIG. 10 is a detailed circuit diagram of the clamping part 850 of FIG. 8.

As mentioned earlier, the clamping part 850 logically combines the first, second, and third detection signals bbweb_1, bbweb_2, and bbweb_3 to output a fourth detection signal bbweb_4 that causes the negative voltage VBBW level to be temperature-dependent between the first voltage and the second voltage.

To be more specific, the fourth detection signal bbweb_4 has basically the same logic level as the third detection signal bbweb_3. However, the fourth detection signal bbweb_4 is disabled (the negative voltage is pumped) unconditionally when the first detection signal bbweb_1 is disabled (when the negative voltage VBBW level is higher than the first voltage that is the maximum), and is enabled (the negative voltage is not pumped) unconditionally when the second detection signal bbweb_2 is enabled (when the negative voltage VBBW level is lower than the second voltage that is the minimum).

As shown in the drawing, the clamping part 850 is provided with a first NOR gate 1001 that logically combines the second detection signal bbweb_2 and the third detection signal bbweb_3, and a second NOR gate 1002 that logically combines an inverted signal of the first detection signal bbweb_1 from an inverter I32 and an output of the first NOR gate 1001 to output a fourth detection signal bbweb_4.

In operation, when the first detection signal bbweb_1 is disabled and inputted to the inverter I32 as a 'low' signal, a 'high' signal is applied to the second NOR gate 1002. Then, the fourth detection signal bbweb_4 is disabled as a 'low' signal and outputted.

When the second detection signal bbweb_2 is enabled and becomes 'high', the first detection signal bbweb_1 is also enabled and becomes 'high' (this is natural because the level of a negative voltage to enable the second detection signal is lower than the level of a negative voltage to enable the first detection signal). Therefore, the fourth detection signal bbweb_4 is enabled as 'high' and outputted from the second NOR gate 1002.

In case the level of the negative voltage VBBW is between the first voltage and the second voltage, the first detection signal bbweb_1 becomes 'high', while the second detection signal bbweb_2 becomes low'. Thus, a logic level of the fourth detection signal bbweb_4 outputted from the second NOR gate 1002 becomes equal to that of the third detection signal bbweb_3. At this time, the negative voltage VBBW, of a level varying depending on the temperature, is pumped.

Figure 11:
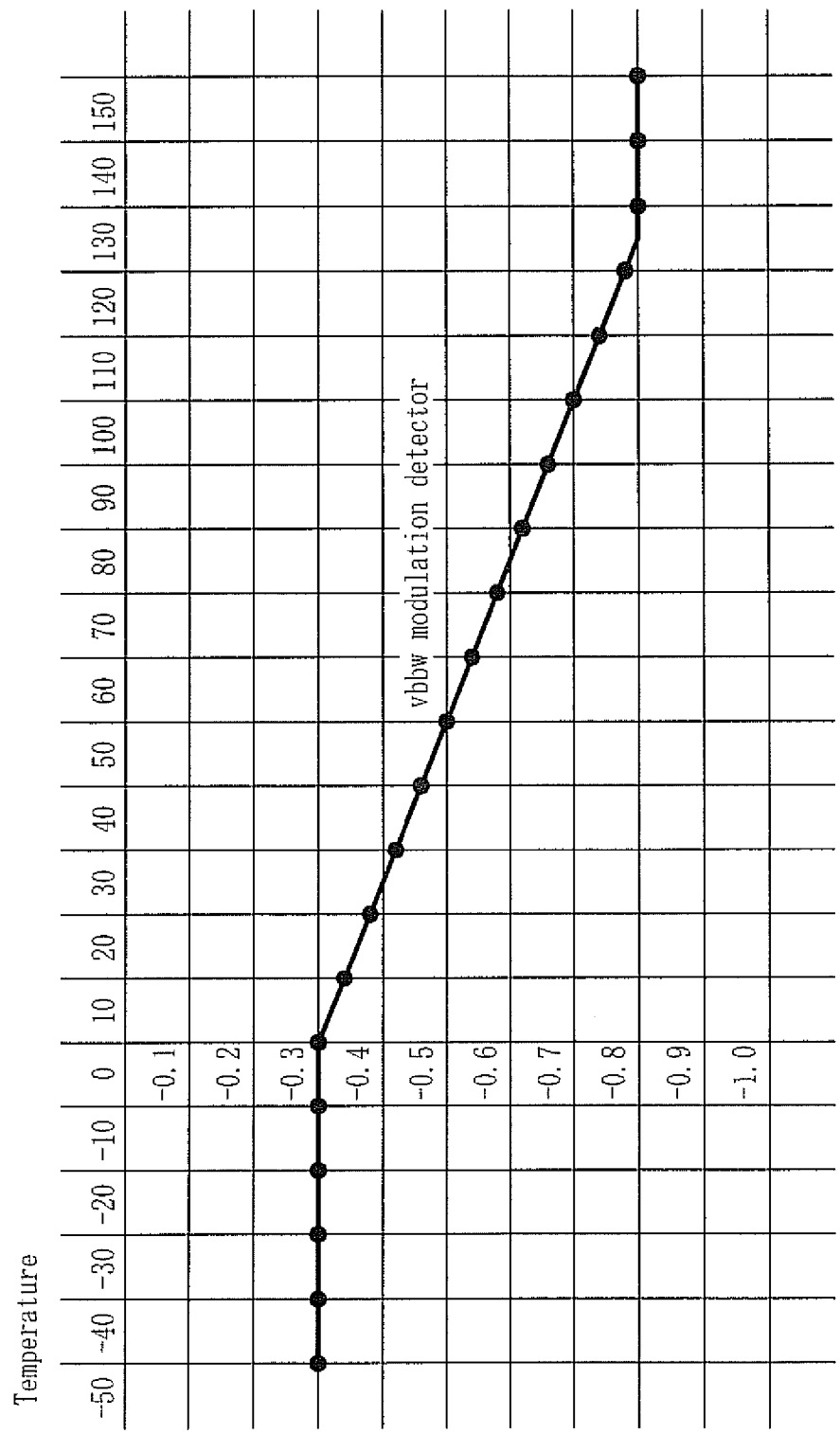
FIG. 11 is a graph showing the relationship between levels of a negative voltage generated by the negative voltage supply device shown in FIG. 8, and temperature.

FIG. 11 is a graph showing the relation between levels of the negative voltage VBBW generated by the negative voltage supply device of FIG. 8 and temperature.

It shows that the first voltage level is set to −0.3 V, and the second voltage level is set to −0.8 V.

From the graph, it can be seen that the negative voltage supply device generates the negative voltage VBBW of lower levels as temperatures are raised, but the maximum and minimum values thereof are limited to the first voltage (−0.3 V) and the second voltage (−0.8 V), respectively.

As explained so far, the negative voltage supply device of the invention can supply a low level negative voltage at high temperatures, and a high level negative voltage at low temperatures.

Thus, when the negative voltage supply device of the invention is applied to a memory device, the leakage current of cell transistors can be prevented by supplying a sufficiently low level negative voltage at a high temperature. In addition, unnecessary current consumption may be prevented by supplying, at a low temperature, a negative voltage of higher level than that of a high temperature.

In addition, when the negative voltage supply device of the invention is applied to a system that requires a negative voltage and in which its level varies depending on temperature, current consumption of the entire system can be reduced.

Moreover, when implemented in the way as shown in FIG. 8, the negative voltage supply of the invention supplies negative voltage of different levels according to temperature variations, while the maximum and minimum levels of the negative voltage to be supplied are restricted. This allows a system with the negative voltage supply device to operate very stably.

While the present invention has been described with respect to the specific embodiments, it will be apparent to those skilled in the art that various changes and modifications may be made without departing from the spirit and scope of the invention as defined in the following claims.

What is claimed is:

1. A negative voltage supply device, comprising:
a first negative voltage detector for detecting a level of a negative voltage to output a first detection signal indicating that the level of the negative voltage is less than a first voltage;
a second negative voltage detector for detecting a level of the negative voltage to provide a second detection signal indicating that the level of the negative voltage is less than a second voltage which is lower than the first voltage;
a third negative voltage detector for detecting a level of the negative voltage to generate a third detection signal indicating that the level of the negative voltage is less than a third voltage varying with temperature;
a clamping part for logically combining the first detection signal, the second detection signal, and the third detection signal to output a fourth detection signal causing a level of the negative voltage to be dependent on temperature between the first voltage and the second voltage; and
a negative voltage pumping unit for pumping the negative voltage in response to the fourth detection signal,
wherein the first and second voltages have a constant voltage level, respectively.

2. The negative voltage supply device of claim 1, wherein the third voltage is lowered as the temperature is raised.

3. The negative voltage supply device of claim 1, wherein the third negative voltage detector detects a level of the negative voltage by using a first element and a second element, which have a different degree of change in their respective resistance values depending on temperature variations.

4. The negative voltage supply device of claim 3, wherein the third negative voltage detector allows the first element to operate as a pull-up resistor and the second element to operate as a pull-down resistor, and generates the third detection signal by voltage distribution of the first element and the second element.

5. The negative voltage supply device of claim 4, wherein the first element includes a PMOS transistor whose gate takes a ground voltage and source receives a higher voltage, the second element includes an NMOS transistor whose source receives the negative voltage and gate accepts the higher voltage, and the drains of the PMOS transistor and the NMOS transistor are connected to each other.

6. The negative voltage supply device of claim 5, wherein the third negative voltage detector outputs the third detection signal through at least one inverter taking a voltage of the drain terminal.

7. The negative voltage supply device of claim 1, wherein the clamping part causes the fourth detection signal having the same logic level as the third detection signal to be disabled when the first detection signal is disabled, and causes the fourth detection signal to be enabled when the second detection signal is enabled.

8. The negative voltage supply device of claim 7, wherein the clamping part includes:
   a first NOR gate for logically combining the second detection signal and the third detection signal; and
   a second NOR gate for logically combining an inverted signal of the first detection signal and an output from the first NOR gate to output the fourth detection signal.

9. The negative voltage supply device of claim 8, wherein the negative voltage pumping unit includes:
   an oscillator for generating a periodic signal in response to the fourth detection signal;
   a pump controller for outputting pump control signals in response to an output signal from the oscillator; and
   a charge pump for pumping the negative voltage in response to the pump control signals.

* * * * *